United States Patent
Gwinn et al.

(10) Patent No.: US 11,915,906 B2
(45) Date of Patent: Feb. 27, 2024

(54) WAFER SCANNING APPARATUS AND METHOD FOR FOCUSED BEAM PROCESSING

(71) Applicant: TEL Manufacturing and Engineering of America, Inc., Chaska, MN (US)

(72) Inventors: Matthew Gwinn, Winchendon, MA (US); Paul Consoli, Ipswich, MA (US); Jerry Negrotti, Beverly, MA (US)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 0 days.

(21) Appl. No.: 18/163,534

(22) Filed: Feb. 2, 2023

(65) Prior Publication Data
US 2023/0187168 A1   Jun. 15, 2023

Related U.S. Application Data

(62) Division of application No. 17/070,192, filed on Oct. 14, 2020, now Pat. No. 11,587,760.
(Continued)

(51) Int. Cl.
*H01J 37/20* (2006.01)
*C23C 14/46* (2006.01)
(Continued)

(52) U.S. Cl.
CPC ............. *H01J 37/20* (2013.01); *C23C 14/46* (2013.01); *C23C 14/505* (2013.01);
(Continued)

(58) Field of Classification Search
CPC ............. H01J 37/20; H01J 37/317; H01J 2237/20228; H01L 21/68; C23C 14/46; C23C 14/505
(Continued)

(56) References Cited

U.S. PATENT DOCUMENTS 6,559,461 B1 *  5/2003  Seo .................. H01L 21/68
                                                250/398
7,608,843 B2   10/2009  Freytsis et al.
(Continued)

FOREIGN PATENT DOCUMENTS

| EP | 0962547 A1 | 12/1999 |
|---|---|---|
| JP | 2008188718 A | 8/2008 |
| KR | 20130141665 A | 12/2013 |

OTHER PUBLICATIONS

Notification of Transmittal of the International Search Report and the Written Opinion of the International Searching Authority and the International Search Report and Written Opinion, PCT Application No. PCT/US2021/018840, dated Jun. 11, 2021, 8 pages.

*Primary Examiner* — Nicole M Ippolito
(74) *Attorney, Agent, or Firm* — Slater Matsil, LLP

(57) ABSTRACT

A method of scanning a wafer includes placing the wafer over a substrate holder inside a processing chamber, where the wafer is placed at a first twist angle relative to a reference axis of a rotatable feedthrough of the processing chamber. The method further includes performing a first pass scan by exposing the wafer to an ion beam while driving two rotary drives disposed in a scanning chamber synchronously to generate a planar motion of the wafer from a rotational motion of the two rotary drives, where the wafer is oriented continuously at the first twist angle when performing the first pass scan.

20 Claims, 12 Drawing Sheets

Related U.S. Application Data

(60) Provisional application No. 63/015,157, filed on Apr. 24, 2020.

(51) Int. Cl.
*C23C 14/50* (2006.01)
*H01J 37/31* (2006.01)
*H01J 37/317* (2006.01)
*H01L 21/68* (2006.01)

(52) U.S. Cl.
CPC ............ *H01J 37/317* (2013.01); *H01L 21/68* (2013.01); *H01J 2237/20228* (2013.01)

(58) Field of Classification Search
USPC ... 250/440.11, 441.11, 442.11, 443.1, 492.1, 250/492.2
See application file for complete search history.

(56) References Cited

U.S. PATENT DOCUMENTS

| | | |
|---|---|---|
| 8,791,430 B2 | 7/2014 | Gwinn et al. |
| 2010/0118364 A1* | 5/2010 | Noh .................... G02B 26/101 359/200.3 |
| 2012/0223249 A1 | 9/2012 | Gwinn et al. |
| 2013/0260034 A1 | 10/2013 | Pak et al. |
| 2015/0343630 A1 | 12/2015 | Tashiro |
| 2017/0040203 A1 | 2/2017 | Caveney et al. |

* cited by examiner

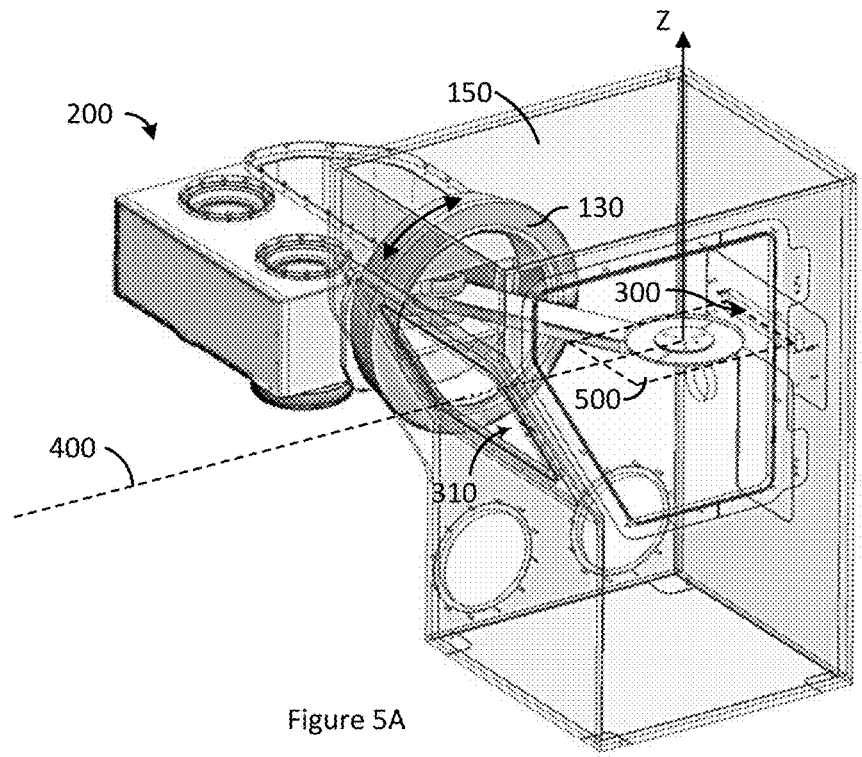
Figure 5A
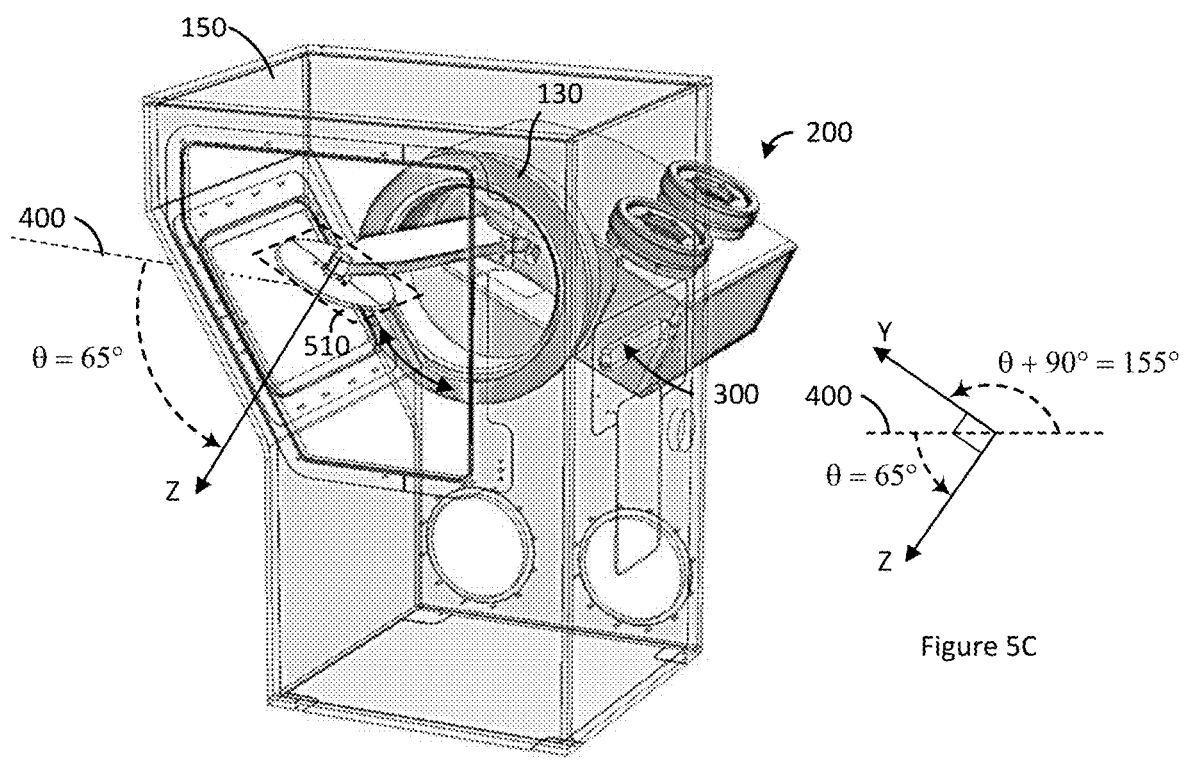
Figure 5B
Figure 5C

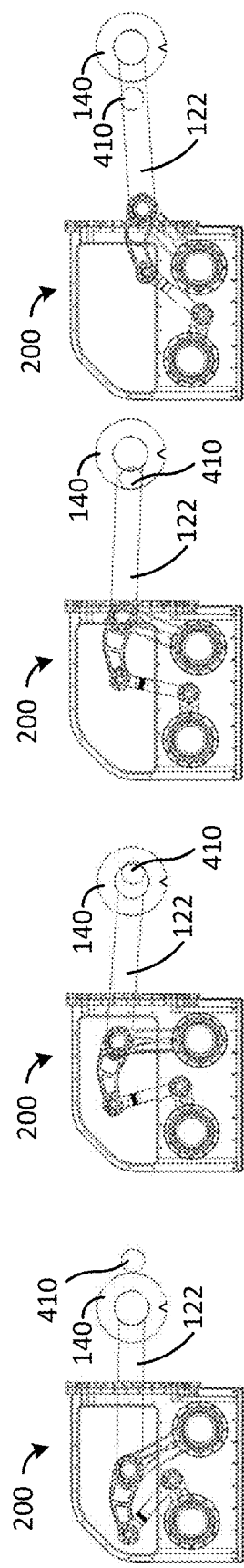

WAFER SCANNING APPARATUS AND METHOD FOR FOCUSED BEAM PROCESSING

CROSS-REFERENCE TO RELATED APPLICATIONS

This application is a divisional of U.S. patent application Ser. No. 17/070,192, filed on Oct. 14, 2020, which claims the benefit of U.S. Provisional Application No. 63/015,157, filed on Apr. 24, 2020, which applications are hereby incorporated herein by their reference.

TECHNICAL FIELD

The present invention relates generally to a system and method of processing a wafer with a focused beam, and, in particular embodiments, to a wafer scanning apparatus and method for focused beam processing.

BACKGROUND

Generally, advancements in integrated circuit (IC) technology are driven by a demand for higher functionality at reduced cost. An IC is an electronic circuit integrated in a monolithic structure. The circuit network comprises electronic components (e.g., transistor, resistor, and capacitor) interconnected by a multilevel system of conductive lines, contacts, and vias. Elements of this network are formed layer-by-layer by a sequence of deposition and patterning of dielectric, metal, and semiconductor layers over a semiconductor substrate or wafer. The demand for higher functionality at reduced cost is met by increasing the packing density of elements of the network through miniaturization. In IC technology, periodic reductions in feature sizes have repeatedly increased the packing density. This reduces the cost per component and increases functionality, (e.g., more logic gates and memory per unit area).

While miniaturization provides many benefits, it intensifies the challenge of providing manufacturable IC fabrication technology. Processes used to fabricate IC's include those where a surface of the wafer is exposed to a beam focused onto the surface, localized in a spot much smaller than the wafer. The wafer may, thus, be scanned through the beam using a wafer scanning apparatus to expose the entire surface to the beam. With reduction of feature sizes and improvements in beam processing, the wafer scanning apparatus has to provide higher accuracy and flexibility in positioning the wafer during processing. Wafer scanning apparatus are also used for other applications such as integrated photonics and microelectromechanical system (MEMS), as well as for imaging (e.g., scanning electron microscopy (SEM) and atomic force microscopy (AFM)).

Wafer scanning apparatus and methods of various designs are deployed in process steps such as photolithography, ion implantation, focused ion beam (FIB) milling, and gas cluster ion beam (GCIB) processing. For example, during a GCIB process step, the wafer may be scanned through the GCIB to expose the wafer surface uniformly to the beam. As known to persons skilled in the art, GCIB processing involves directing a collimated beam of energetic nanoscale particles to strike a wafer surface, thereby modifying a region close to the surface either physically (e.g., smoothing, sputter cleaning, or implanting dopants), or chemically (e.g., etching, or depositing a thin film by surface chemical reactions), or by a combination of physical and chemical mechanisms. The particle beam, referred to as the GCIB, comprises a wide distribution of clusters of a few thousand to a few atoms/molecules (even monomers). The clusters may be formed, for example, by releasing pressurized gas into a low pressure vacuum chamber to initiate a condensation process resulting from cooling during adiabatic expansion of a gas. A fraction of the clusters may be subsequently ionized using, for example, bombardment with energetic electrons. A wide variety of gases are used in GCIB processing, from inert gases such as argon to highly reactive gases such as $NF_3$, depending on the application. The ionization charge allows for the gas to be accelerated to a desired high energy and collimated into a beam of a desired spot size using, for example, controlled electrostatic and magnetic acceleration and focusing techniques. The beam cross-section is usually small relative to the area of the wafer surface. Hence, during GCIB processing, some scanning mechanism is used to expose the entire wafer surface to the GCIB. Generally, the wafer is mechanically moved through a stationary beam in order to avoid problems in controlling the spot size and shape during electrostatic scanning of high current ion beams such as those used for GCIB processing.

SUMMARY [TO BE FILLED LATER]

A method of scanning a wafer, the method including: placing the wafer over a substrate holder inside a processing chamber, the wafer being placed at a first twist angle relative to a reference axis of a rotatable feedthrough of the processing chamber; and performing a first pass scan by exposing the wafer to an ion beam while driving two rotary drives disposed in a scanning chamber synchronously to generate a planar motion of the wafer from a rotational motion of the two rotary drives, the wafer being oriented continuously at the first twist angle when performing the first pass scan.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A and 5B illustrate perspective views of a scanning apparatus, and a process chamber during various stages of wafer transfer, in accordance with an embodiment;

FIG. 5C is a sketch illustrating the angular displacement during rotation of the scanning apparatus in FIGS. 5A and 5B;

FIGS. 6A-6D illustrate cross-sectional views of a scanning apparatus loaded with a wafer during various stages of motion along a line, in accordance with an embodiment;

DETAILED DESCRIPTION OF ILLUSTRATIVE EMBODIMENTS

Innovations in scanning apparatus and method may be needed to provide precise control of the position of a wafer in the scanning plane, the in-plane angular orientation of the wafer, and the tilt angle of the wafer relative to the beam incident on the wafer.

Embodiments of wafer scanning apparatus and scanning methods are described that may be advantageous for several focused beam processing steps used in some fabrication process flows for manufacturing of various devices, including electronic IC, integrated photonic, optoelectronic, and MEMS devices. This disclosure describes a wafer scanning system equipped with innovative scanning apparatus to scan a wafer or a substrate through a stationary focused beam localized at a spot on a surface of the wafer. The beam alters a region of the wafer close to the surface area where the beam strikes the wafer. During the process step, the wafer traverses a planar scan area to expose the entire wafer surface to the beam for processing.

First, a wafer scanning system 10 is described with reference to a block diagram illustrated in FIG. 1.

Figure 1:
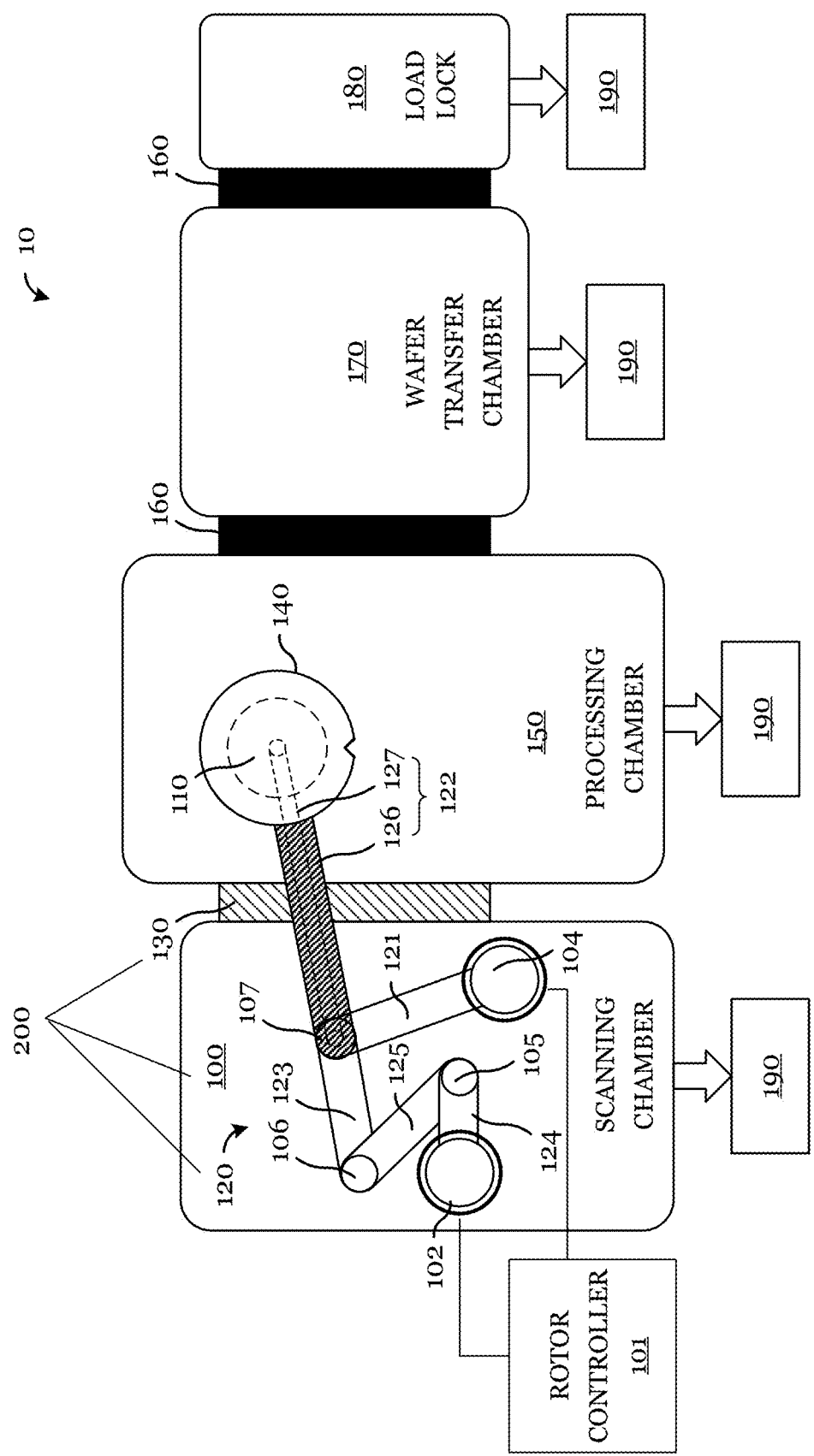
FIG. 1 illustrates a block diagram of a wafer scanning system, in accordance with an embodiment.

The wafer scanning system 10 in FIG. 1 includes a scanning chamber 100 that houses a scanning mechanism comprising actuators, moving parts, hinges, and a substrate holder, collectively referred to as a wafer scanner 120; a processing chamber 150 where a wafer 140 (loaded onto the wafer scanner 120) may intersect a beam (e.g., a GCIB) for processing the wafer 140; and a circular rotatable feedthrough 130 between the scanning chamber 100 and the process chamber 150 through which a moving part of the wafer scanner 120 can access and move the wafer 140 within the processing chamber 150. The combined continuous motion of the movable parts of the wafer scanner 120 and discrete rotary motion of the scanning chamber 100 using the rotatable feedthrough 130 may provide the desired movements of the wafer 140 through the GCIB to complete the GCIB process step. Accordingly, in this embodiment, the scanning chamber 100, the wafer scanner 120, and the rotatable feedthrough 130 are together referred to as the scanning apparatus 200. The full range of motion of the wafer scanning apparatus 200 and of the wafer 140 relative to the directed beam impinging on its surface is described in further detail below.

The wafer scanning system 10 further includes a load lock 180, where wafers for processing may be placed, and a wafer transfer chamber 170, as illustrated in FIG. 1. The wafer 140 may be transported from the load lock 180 to the substrate holder no of the wafer scanner 120 using, for example, an (r, θ, z) robotic arm located in the wafer transfer chamber 170. A wafer transfer window in the processing chamber 150 may be used to transfer the wafer 140 from the wafer transfer chamber 170 to the substrate holder 110.

The wafer scanning system 10 further includes a rotor controller 101 to control the rotary drives of the scanning apparatus 200 as will described in more detail below.

Generally, GCIB processing is performed at a low pressure (e.g., $10^{-12}$ Torr to $10^{-6}$ Torr). As illustrated in FIG. 1, the wafer scanning system 10 may have a vacuum system 190 connected to the scanning chamber 100, the process chamber iso, the wafer transfer chamber 170, and the load lock 180. The connection between the scanning chamber wo and the processing chamber 150 may be controlled by a rotary seal in the rotatable feedthrough 130, and the connections between the load lock 180, the wafer transfer chamber 170, and the processing chamber 150 may be controlled by two gate valves 160, as indicated schematically in FIG. 1. In one embodiment, this allows each chamber of the wafer scanning system 10 to be isolated and maintained at an independently controlled pressure using, for example, throttle valves. One advantage of having separate scanning and processing chambers is that it helps protect moving parts of the wafer scanner 120 from contaminants originating in the processing chamber 150. In one embodiment, controlled pressure difference between the scanning chamber 100 and the processing chamber 150 may be maintained to prevent byproducts produced inside the processing chamber 150 during GCIB processing from entering the scanning chamber 100 and getting deposited on the parts of the wafer scanner 120.

Figure 2:
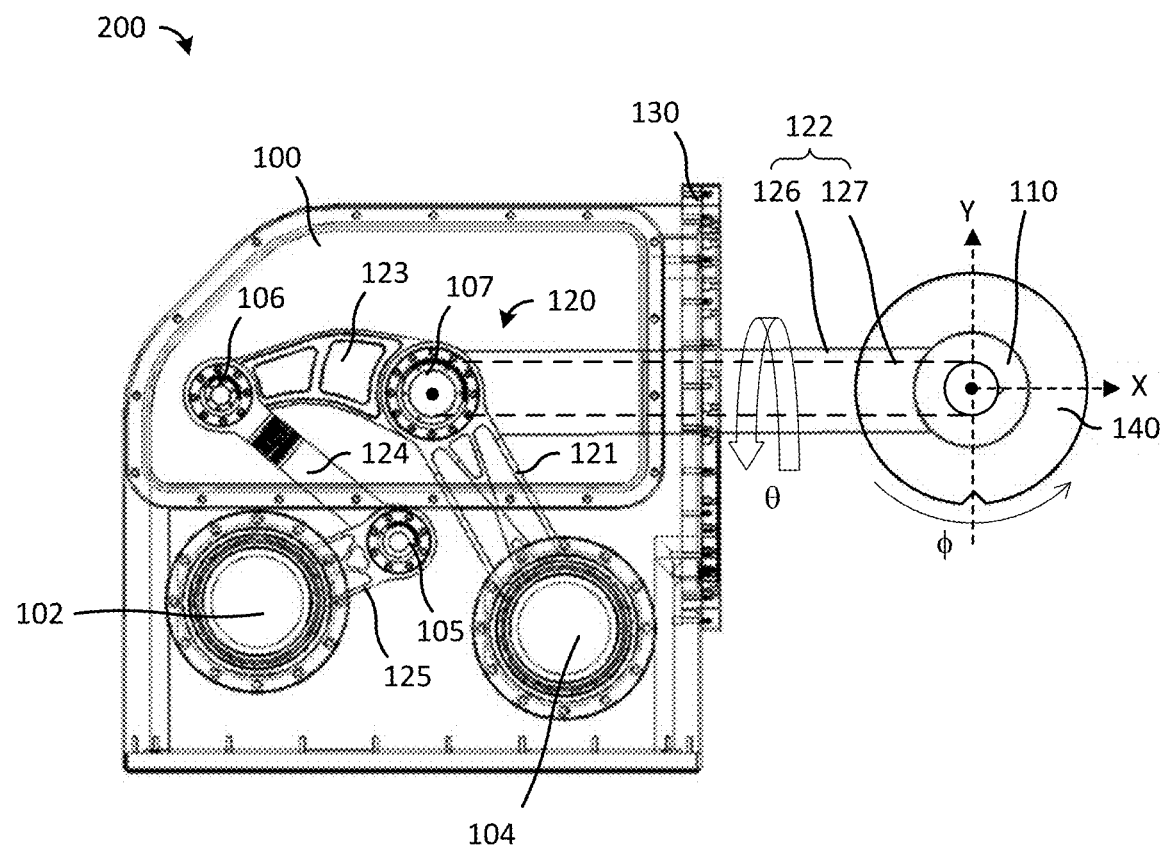
FIG. 2 illustrates a cross-sectional view of a scanning apparatus loaded with a wafer, in accordance with an embodiment.

FIG. 2 illustrates a cross-sectional view of a prototype of the scanning apparatus 200 shown schematically in FIG. 1. In one embodiment, two rotary drives (a first rotary drive 102 and a second rotary drive 104) are used as the primary actuators of the wafer scanner 120. One advantage of using rotary drives is cleanliness, hence lower maintenance cost because, unlike linear bearings, rotary bearings may be sealed from contaminants in the ambient. Synchronous angular displacements of the first and the second rotary drives 102 and 104 may be accurately computed in accordance with a desired planar trajectory of the center of the substrate holder 110, and subsequently used by a rotor controller 101 (FIG. 1) to generate the computed synchronized rotational motions with high precision using, for example, electronically controllable motors. Control of backlash in the mechanical design of rotary parts may be important for precise positioning of the wafer 140. Generally, the choices of drives, couplings and bearings are made to reduce backlash. The synchronized pair of rotations actuated by the first and the second rotary drives 102 and 104 is converted to a target scan trajectory of the center of the substrate holder 110 via various other moving parts of the wafer scanner 120. The trajectory of the substrate holder 110, hence, also the trajectory of the wafer 140 loaded onto the substrate holder 110, is substantially coplanar with (or parallel to) the processing surface of the wafer 140.

In one embodiment, the rotational motion of the first and the second rotary drives 102 and 104 may be translated to a planar motion along the plane of the surface of wafer 140 using a bar-and-hinge system comprising five bar links (a first bar link 121, a second bar link 123, a third bar link 124, a fourth bar link 125, and a belted fifth bar link 122), and three hinges (a first hinge 105, a second hinge 106, and a third hinge 107) about which the bar links can rotate.

The belted fifth bar link 122 comprises a bar link 126 and a motorized belt-and-pulley system 127 in the bar link 126. The motorized belt-and-pulley system 127 may be used to orient the wafer 140 by rotating the planar surface of the substrate holder no along with the wafer 140. In various other embodiments, the mechanism used to rotate the substrate holder no may be implemented differently, as discussed in further detail below.

As illustrated in FIG. 2, the first and the second rotary drives 102 and 104 are affixed to the body of the scanning chamber 100. Each rotary drive rotates one end of a respective bar link directly connected to the drive.

In FIG. 2, the fourth bar link 125 is attached to the first rotary drive 102 and, at the opposite end, to a free moving first hinge 105. The first bar link 121, attached to the second rotary drive 104, has its opposite end connected to another free moving third hinge 107. The pair of synchronized rotations of the actuated first and fourth bar links 121 and 125 (synchronized by the rotor controller, as described above) causes a respective synchronized pair of displacements of the first and the third hinges 105 and 107. The first and the third hinges 105 and 107 transmit the motion to other bar links attached to the first and the third hinges 105 and 107.

First hinge 105 is attached to one end of the third bar link 124, and third hinge 107 is attached to one end of the second bar link 123. The opposite ends of the second and the third bar links 123 and 124 are both connected to the second hinge 106. This causes a motion of the second hinge 106 conforming to the trigonometric relations between the angles of a triangle having two sides determined by the lengths of two bar links (second and third bar links 123 and 124) and the third side being the line segment connecting the first and the third hinges 105 and 107. The distance between the first and the third hinges 105 and 107 is determined by a combination of their synchronized displacements described above. In one embodiment, the repositioning of second hinge 106 determines the trajectory of the center of the substrate holder no (and of the wafer 140), as explained herein.

One end of the belted fifth bar link 122 has been attached to the substrate holder no and the opposite end is attached to the third hinge 107 and the second bar link 123. The connection between the second bar link 123 and the belted fifth bar link 122 allows the two-bar combination to pivot around the third hinge 107 while the angle formed by the two bars is held fixed. Accordingly, in this embodiment of the wafer scanner 120, the location of the center of the substrate holder no is uniquely determined by the combined positions of second and third hinges 106 and 107 and the combined lengths of the second bar link 123 and the belted fifth bar link 122.

As illustrated in FIG. 2, in one embodiment, the wafer 140 is placed on the substrate holder no such that the centers of the substrate holder no and wafer 140 are substantially coincident. The common center point is defined as the origin of a three-dimensional rectangular coordinate system (X, Y, Z), as illustrated in FIG. 2 and subsequent figures in this disclosure. The X-Y plane is the plane containing the planar trajectory derived from the synchronized rotations of the first and the second rotary drives 102 and 104, as described above. As illustrated in FIG. 2, the X-Y plane is virtually same (or coplanar) as the surface of the wafer 140 (or the substrate holder no). Accordingly, the Z-axis (not visible in the two-dimensional view in FIG. 2) points in a direction normal to this surface. The direction of the Y-axis could be selected along any particular orientation in the plane of the wafer. For specificity, in the figures in this disclosure, the Y-axis is selected to pass through a wafer notch. It is also customary to indicate a particular orientation of a crystalline semiconductor substrate by a physical mark on the wafer, such as the notch near the circumference of the circular wafer 140 in FIG. 2.

The angle formed by the Z-axis (or any other line normal to the X-Y plane) and the collimated processing beam (e.g., the GCIB) is referred to as the tilt angle, $\theta$. In FIG. 2, the surface of the wafer 140 is vertical with the notch towards the bottom and, it is implicitly assumed that the GCIB is incident horizontally perpendicular to the wafer surface, indicated as the X-Y plane. Accordingly, in FIG. 2, tilt angle $\theta = 0°$. In one embodiment, one side of the rotatable feedthrough 130 is attached rigidly (e.g., bolted) on to a wall of the scanning chamber 100. The opposite side may be placed on rotary bearings attached to an adjacent wall of the processing chamber 150, thereby allowing the scanning chamber 100 to be rotated about an axis passing through the center of the circular rotatable feedthrough 130 and normal to the wall of the processing chamber to which the rotary part of the rotatable feedthrough 130 is attached. In one embodiment, the tilt angle, $\theta$, may be adjusted by rotating the scanning chamber 100 and wafer scanner 120 using the rotatable feedthrough 130, as indicated by the curved arrow in FIG. 2. The rotatable feedthrough 130 may rapidly rotate the wafer scanning apparatus 200 to adjust the tilt angle $\theta$ to any desired value. In one embodiment, $\theta$ could be varied over a 155° range ($-90° \leq \theta \leq 65°$), and the wafer could be moved from a horizontal loading position to a tilt of 65° in about 8 seconds to about 10 seconds. The horizontal GCIB remains stationary. The range may be limited during wafer processing. In one embodiment, the tilt angle is between $-65°$ and $+65°$ ($-65° \leq \theta \leq 65°$) during processing. In some other embodiments the range for $\theta$ may be larger. The tilted wafer 140 may be scanned through the GCIB by the wafer scanner 120 to perform the GCIB process step with the GCIB striking the surface at a desired tilt angle. Beam processing with a tilt angle, $\theta$, is illustrated in further detail below with reference to FIGS. 4A through 5C.

As mentioned above, the wafer is processed by scanning its surface through a stationary processing beam (e.g., a stationary GCIB). In the embodiments described in this disclosure, the scan trajectory of any point on the wafer surface is coplanar with the roughly planar surface of the wafer, or equivalently, the scanning plane and the processing plane are coincident. One advantage of using scanning apparatus where the scanning plane is roughly same as the processing plane is that the distance between the beam source and the beam spot (the spot where the wafer intersects the beam) is roughly constant throughout the scan, even at large tilt angles. This is advantageous in keeping the beam focused on the wafer during the entire wafer scan, thereby improving control over the size and shape of the beam spot.

In FIG. 2 and other figures in this disclosure, for specificity, it has been assumed that the scanning apparatus 200 is orientated such that the circular rotatable feedthrough 130 is roughly in a vertical plane, and the stationary GCIB used for processing the wafer is a horizontal beam. The direction of the stationary horizontal GCIB relative to the scanning apparatus 200 has been assumed to be such that the beam is directed perpendicular to the family of lines normal to the vertical plane of the rotatable feedthrough 130 intersecting the GCIB.

Still referring to FIG. 2, at any fixed tilt angle, θ, the wafer 140 may be rotated in-plane through a twist angle φ, without altering tilt angle θ, as indicated by an arc-shaped arrow in FIG. 2. Generally, zero twist angle (φ=0°) is defined to be the orientation of the wafer 140 in FIG. 2, where the notch is downwards when the wafer 140 is held vertically (θ=0°), perpendicular to a horizontal GCIB. Since the Y-axis is defined as coincident with the diameter which passes through the notch, the twist angle, φ, is the angular position of the Y-axis relative to the Y-axis at φ=0°. Accordingly, the twist angle, φ, may be defined to be the angle formed between the X-axis and a reference axis perpendicular to the planar face of the rotatable feedthrough 130. In one embodiment, φ may be set to any value in the range 0°≤φ≤360°, where, by convention, twist angle φ is considered to be increasing with counterclockwise rotation and decreasing with clockwise rotation. For example, if the wafer 140 in FIG. 2 were rotated a quarter-circle counterclockwise about the Z-axis then the notch would be towards the right, and φ=90°. For a rotation through a half-circle, φ=180°, and φ=270° for another quarter-circle beyond that. Here, the Y-axis has been defined by the position of the notch, so altering the twist angle from 0° to φ is equivalent to rotating the X-Y axes about the Z-axis by a twist angle φ. The angles θ and φ are analogous to the polar angle and azimuthal angle, respectively, of a spherical coordinate system. Consider a wafer 140 positioned with a tilt angle, θ, and a twist angle, φ being scanned through a GCIB by the wafer scanner 120. Then θ is the angle formed by the Z-axis and the GCIB, and φ is the angle formed by the Y-axis and an orthogonal projection of the GCIB on the X-Y plane.

In this embodiment, the wafer 140 may be loaded onto the substrate holder no at a particular wafer orientation (e.g., at φ=0°), and subsequently rotated about the Z-axis by a specified twist angle, φ. The loaded wafer 140 and the substrate holder no may be rotated together about an axis passing perpendicularly through the face of the circular rotatable feedthrough 130 by a tilt angle, θ, prior to moving the wafer through the processing beam (e.g., a GCIB). The tilt angle θ of the wafer 140 relative to the GCIB alters the angle at which the beam strikes the wafer surface and this influences the outcome of the processing (e.g., angle-dependence of etch rate). The twist angle may also influence the outcome of the processing. In-plane rotation through a twist angle φ, alters the position of the notch and, hence the orientation of all features formed on the wafer 140 (and crystal orientation if crystalline material is present) relative to the GCIB. Although, this does not alter the tilt angle (θ) of the wafer surface relative to the GCIB, altering the twist angle φ may alter, for example, the geometrical impact of an etch on a feature such as a long and narrow trench, or affect a dopant profile through a crystal orientation effect such as implant channeling. Accordingly, it is desirable that the scanning apparatus 200 provides the means to reduce variations in the tilt angle and the twist angle during the wafer scan. The wafer 140 may be loaded onto the substrate holder no, oriented at a desired pair of values for tilt angle θ and twist angle φ and scanned through the GCIB along a planar trajectory in the X-Y plane. The scanning motion generated using the rotary drives and the bar-and-hinge system of the wafer scanner 120 may not affect the tilt angle, θ. However, additional parts such as the motorized belt-and-pulley system 127 may be used to control the twist angle, φ, along the scan trajectory, as discussed further below with reference to FIGS. 8A-8F.

Generally, the values for tilt angle θ and twist angle φ are held roughly constant during a scan. For process steps where it is desired that the surface be exposed to the processing beam at several discrete combinations of tilt angle θ and twist angle φ, the process recipe may be constructed to pass the wafer through several scans with the tilt and twist angles (θ, φ) combination being altered between successive scans. The twist angle may be adjusted without removing the wafer 140 from the substrate holder no using, for example, an electronically controlled motorized belt-and-pulley system 127.

Although the embodiments described in this disclosure are designed to maintain tilt and twist angles (θ, φ) roughly constant during a single scan of the entire wafer surface, it is understood that the scanning apparatus 200 may be modified to change the tilt angle θ, or the twist angle φ, or both in a single scan in a controlled manner. For example, one selected region of the wafer 140 may be scanned with one pair of values, a first pair of tilt and twist angles ($θ_1$, $φ_1$), the scan halted to change the controlled orientation to a different pair of values, a second pair of tilt and twist angles ($θ_2$, $φ_2$). After the change in orientation, a different region of wafer 140 may be scanned using the new pair of values, the second tilt and twist angles ($θ_2$, $φ_2$). The tilt angle, or the twist angle, or both may be dynamically controlled while the wafer 140 is being scanned through the beam. As mentioned above, in order to maintain a constant twist angle, φ, while the wafer 140 is scanned in the X-Y plane, the wafer 140 may be rotated dynamically without removing the wafer 140 from the substrate holder no. The twist angle control is discussed further with reference to FIGS. 8A-8F.

Figure 3A:
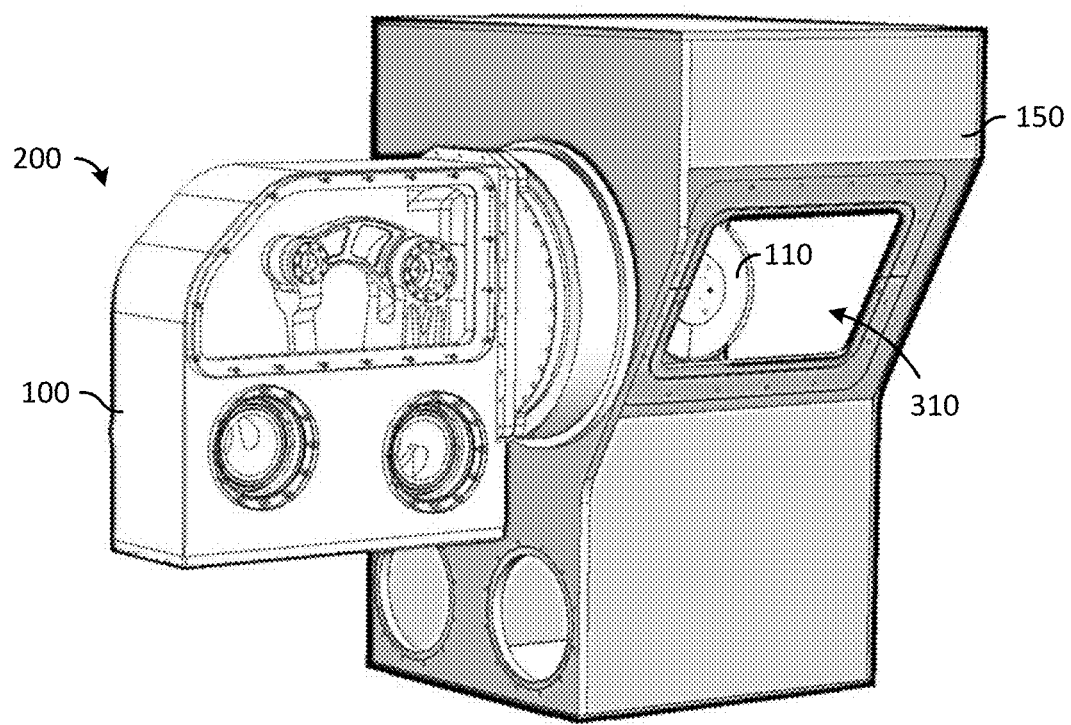
FIGS. 3A and 3B illustrate perspective views of a scanning apparatus, and a process chamber, in accordance with an embodiment.
Figure 3B:
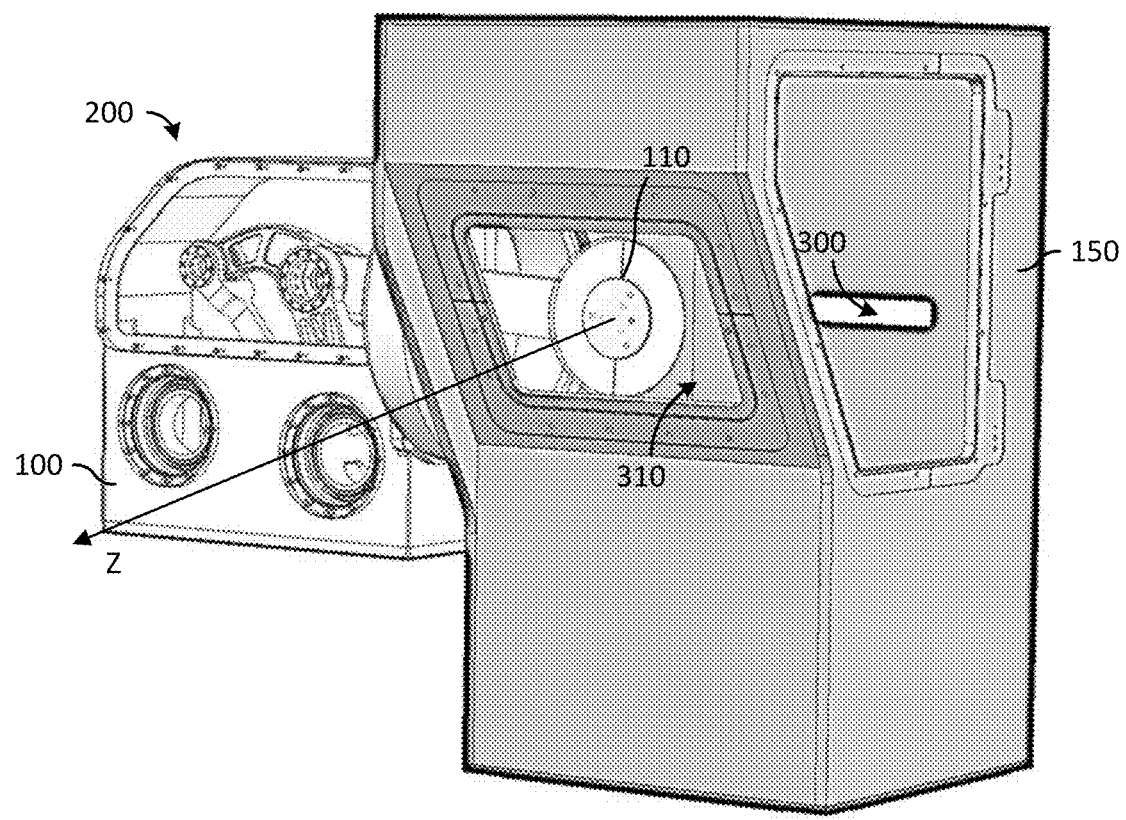

FIGS. 3A and 3B illustrate two perspective views of the same embodiment of the scanning apparatus 200 (described above with reference to FIGS. 1 and 2) and a processing chamber 150. As mentioned above, most of the parts of the scanning apparatus 200 may be located in the scanning chamber 100 outside the processing chamber 150 where the equipment may be isolated from contaminating byproducts generated during processing in the processing chamber 150. The processing chamber 150 may be coupled to processing resources such as an external GCIB source. Although not shown, in FIGS. 3A and 3B, the processing chamber 150 may be coupled to the GCIB source attached to a beam window 310 and connected via an aperture in the beam window 310 of about 30 mm to about 90 mm in diameter. A stationary horizontal beam from the GCIB source may pass through the aperture and enter the processing chamber 150 where the wafer 140 intersects the GCIB for beam processing.

In FIG. 3B, a wafer transfer window 300 located in the wall of the processing chamber 150 opposite the beam window 310 is visible. The wafer transfer window 300 may be used to transfer a wafer 140 from the wafer transfer chamber 170 (see FIG. 1) to the substrate holder no illustrated inside the processing chamber 150, in FIGS. 3A-3B. The use of isolated scanning chamber 100 and processing chamber 150 in the design of scanning system 10 and the use of rotary drives and rotary bearings in the design of the scanning apparatus 200 provide the advantage of cleanliness and low maintenance cost, as mentioned above.

Figure 4A:
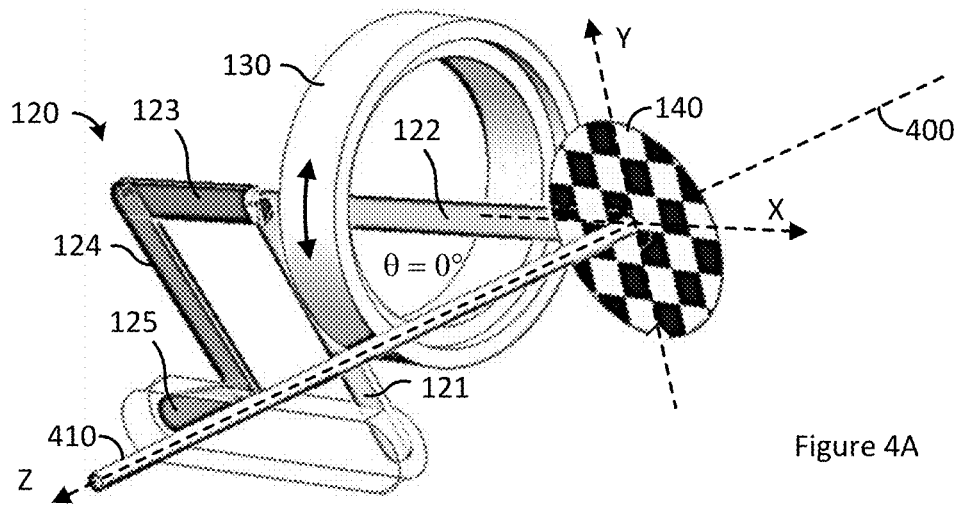
FIGS. 4A-4C illustrate schematics of a scanning apparatus loaded with a wafer rotated through various angles, positioning the wafer at various tilt angles, in accordance with an embodiment.
Figure 4B:
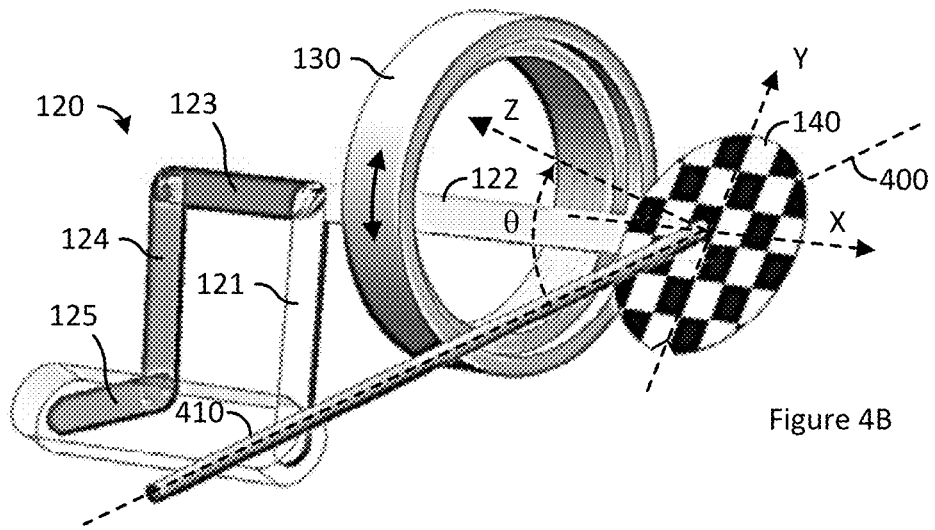
Figure 4C:
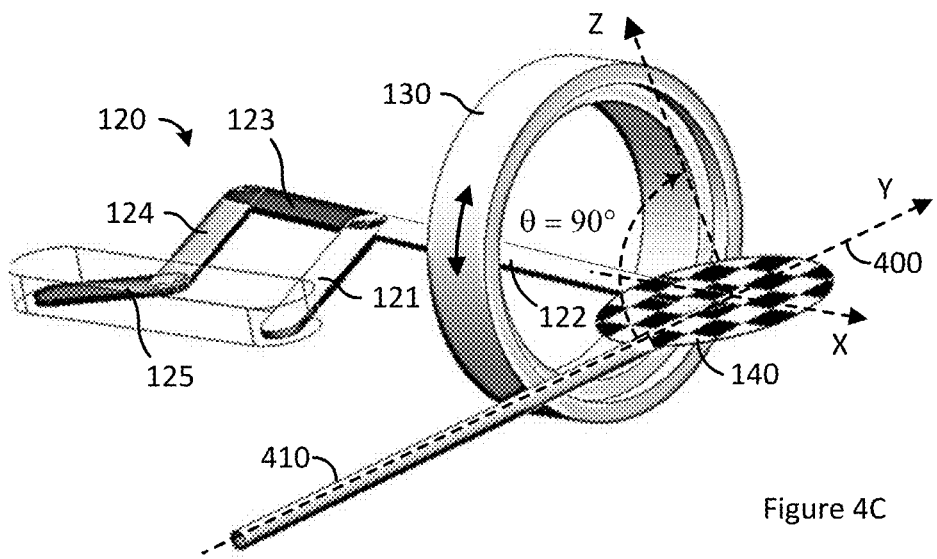

FIGS. 4A-4C schematically illustrate beam processing (e.g., GCIB processing) of a wafer 140 by scanning the wafer 140 through a horizontal stationary GCIB 410 directed along a beam line 400. The wafer 140 is shown loaded on the wafer scanner 120 (comprising the five bar links (first, second, third, and fourth bar links 121, 123, 124, and 125 and belted fifth bar link 122), described above with reference to FIG. 2, and rotated by the rotatable feedthrough 130 to various tilt angles (θ).

In FIG. 4A, the GCIB 410 is illustrated to be incident perpendicular (θ=0°) to the surface of the wafer 140. Accordingly, the Z-axis in FIG. 4A is coincident with the beam line 400. FIG. 4C, illustrates the wafer 140 tilted to a horizontal position (θ=90°), similar to what may be used to transfer the wafer from the wafer transfer window 300 (shown in FIG. 3B). Accordingly, the Y-axis in FIG. 4C is coincident with the beam line 400. An intermediate tilt angle, θ, is illustrated in FIG. 4B. In all the three FIGS. 4A, 4B, and 4C, the twist angle ϕ=0°. Accordingly, it may be noted that, if the GCIB 410 were projected onto the X-Y plane, the projection would coincide with the Y-axis.

The perspective views of the scanning apparatus 200 and the processing chamber 150 in FIGS. 5A and 5B illustrate positioning the scanning apparatus 200 using the rotatable feedthrough 130 to transfer a wafer from the wafer transfer window 300 to a location in the processing chamber where the wafer may intersect the GCIB for processing. FIG. 5A illustrates the initial position and FIG. 5B illustrates the final position. In FIGS. 5A and 5B, a dashed rectangle represents the wafer surface and a dashed line represents the direction of the GCIB.

In FIG. 5A, the dashed rectangle 500, which represents the surface of the wafer (or the X-Y plane), is horizontal when the wafer is passed through the horizontal slit in the wafer transfer window 300. The GCIB (represented by the dashed line 400) is also horizontal. Hence, the tilt angle, θ, which is formed by the horizontal GCIB and the vertical Z-axis, is −90°. The tilt angle is negative because the Z-axis of a vertical wafer facing the GCIB, which is the θ=0° orientation, has to be rotated clockwise by 90° for the Z-axis to point vertically upwards.

The scanning apparatus 200 may be rotated from the initial position shown in FIG. 5A to the final position shown in FIG. 5B using the rotary part of the rotatable feedthrough 130. The rotation becomes apparent if the relative positions of a double arrow marked on the circular rotatable feedthrough 130 in FIGS. 5A and 5B are compared. The rotated surface of the wafer (or the rotated X-Y plane) is the dashed rectangle 510 in FIG. 5B. The GCIB (represented by the dashed line 400) is stationary; so it remains horizontal. The new tilt angle, θ, which is formed by the horizontal GCIB and the new Z-axis, has been selected to be 65° in the example illustrated in FIG. 5B. The angular displacement of the scanning apparatus 200 that transfers the wafer from its initial horizontal orientation near the wafer transfer window 300 in FIG. 5A to its final orientation in FIG. 5B, where it intersects the GCIB (represented by the horizontal dashed line 400) at a tilt angle, θ, is illustrated in FIG. 5C. As illustrated in FIG. 5C, the scanning apparatus 200 has been rotated through (θ+90°)=155° to tilt the wafer from a horizontal position (θ=−90°) to a tilt angle, θ=65°.

FIGS. 6A through 6D illustrate one horizontal trace in a scan trajectory of the wafer 140 performed by the wafer scanning apparatus 200. The wafer 140 is displaced progressively from left to right along a horizontal line as the Figure number progresses from 6A to 6B to 6C to 6D. In each of the FIGS. 6A, 6B, 6C, and 6D a small circle at a fixed position represents the GCIB 410, and may be used as a marker to help observe the progression of the wafer from left to right.

FIG. 6A illustrates the wafer 140 at the leftmost position, where the right edge of the wafer 140 is seen touching the left edge of the GCIB 410. FIG. 6D illustrates the wafer 140 at the rightmost position, where the left edge of the wafer 140 is seen touching the right edge of the GCIB 410. Accordingly, the total horizontal displacement is roughly equal to the diameter of the wafer 140 (and the beam size). A minimum horizontal scan length equal to the sum of the diameters of the wafer 140 and the diameter of the GCIB 410 ensures that the scanning apparatus is capable of spanning the entire wafer from left to right through the processing beam GCIB 410. FIGS. 6B and 6C illustrate two intermediate stages of the linear motion of the wafer.

As illustrated in FIGS. 6A-6D and described above with reference to FIG. 2, the linear motion has been actuated by synchronized rotational motion of the first and the second rotary drives 102 and 104. The wafer 140 is held vertically through the scan (θ=0°) and the twist angle, ϕ=0°. The wafer notch of wafer 140 is at the bottom of the wafer 140 in all the four stages of the linear motion, as illustrated in the respective FIGS. 6A, 6B, 6C, and 6D. The wafer orientation is maintained at the same twist angle by the belted fifth bar link 122, as discussed further below.

FIGS. 7A-7F illustrate the full range of motion by illustrating a circular trajectory of the wafer 140 around the center of the small circle representing the GCIB 410. The wafer 140 is moved by the scanning apparatus 200 in a clockwise circular motion with the GCIB 410 at the center of the circular trajectory. The motion is actuated by synchronized rotational motion of the first and the second rotary drives 102 and 104, similar to the linear motion shown in FIGS. 6A-6D. The center of the wafer 140 traces the circumference of a circle around the center of the beam. The diameter of this trace is equal to the sum of the diameters of the wafer 140 and the diameter of the GCIB 410. The progression of the wafer along the circular trajectory is illustrated by depicting the position of the various parts of the wafer scanner at six locations along the trajectory at 60° intervals. The trajectory starts with the wafer at the leftmost position in FIG. 7A and progresses through FIGS. 7B, 7C, 7D, 7E, and 7F. The wafer 140 is held vertically through the scan (θ=0°) and the twist angle is held constant at ϕ=0° at the various angular positions of the belted fifth bar link 122 illustrated in FIGS. 7A-7F.

Figure 7A:
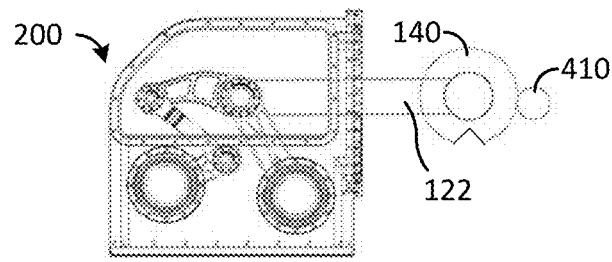
FIGS. 7A-7F illustrate cross-sectional views of a scanning apparatus loaded with a wafer during various stages of motion along a circle, in accordance with an embodiment.
Figure 7B:
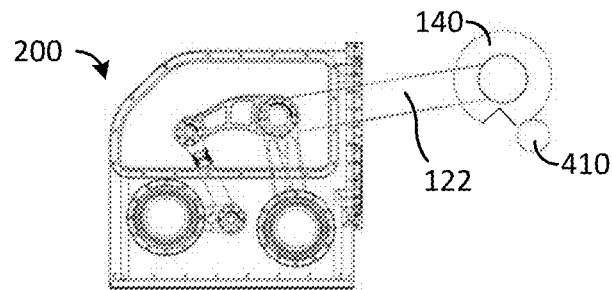
Figure 7C:
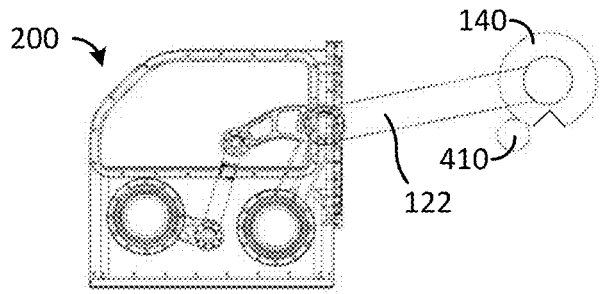
Figure 7D:
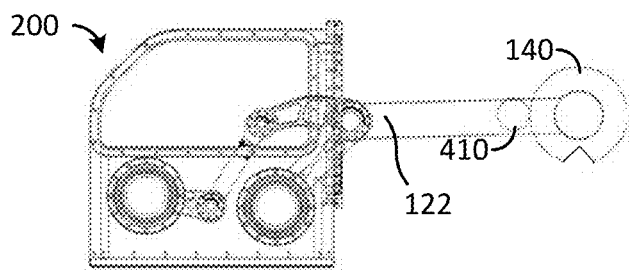
Figure 7E:
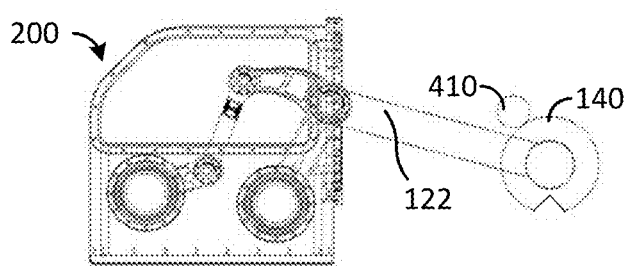
Figure 7F:
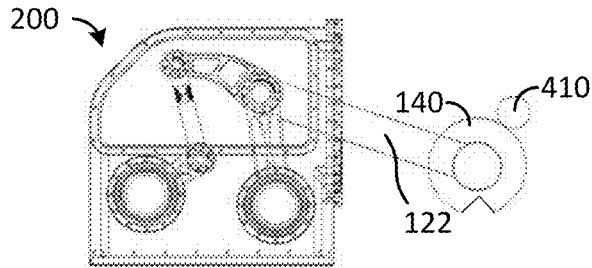
Figure 8A:
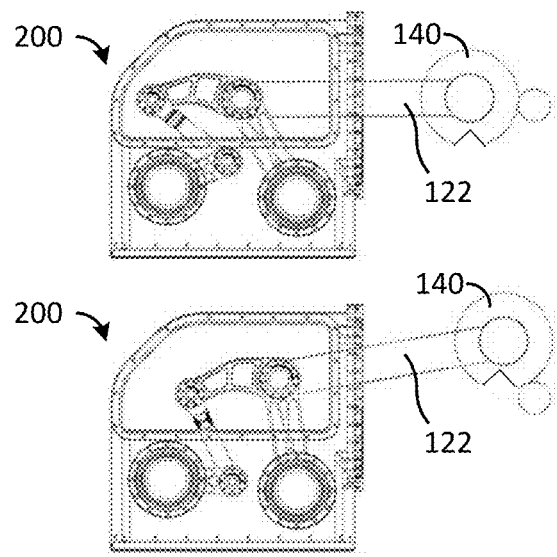
FIG. 8A illustrates a comparison of the cross-sectional views of a scanning apparatus loaded with a wafer illustrated in FIGS. 7A and 7B.
Figure 8B:
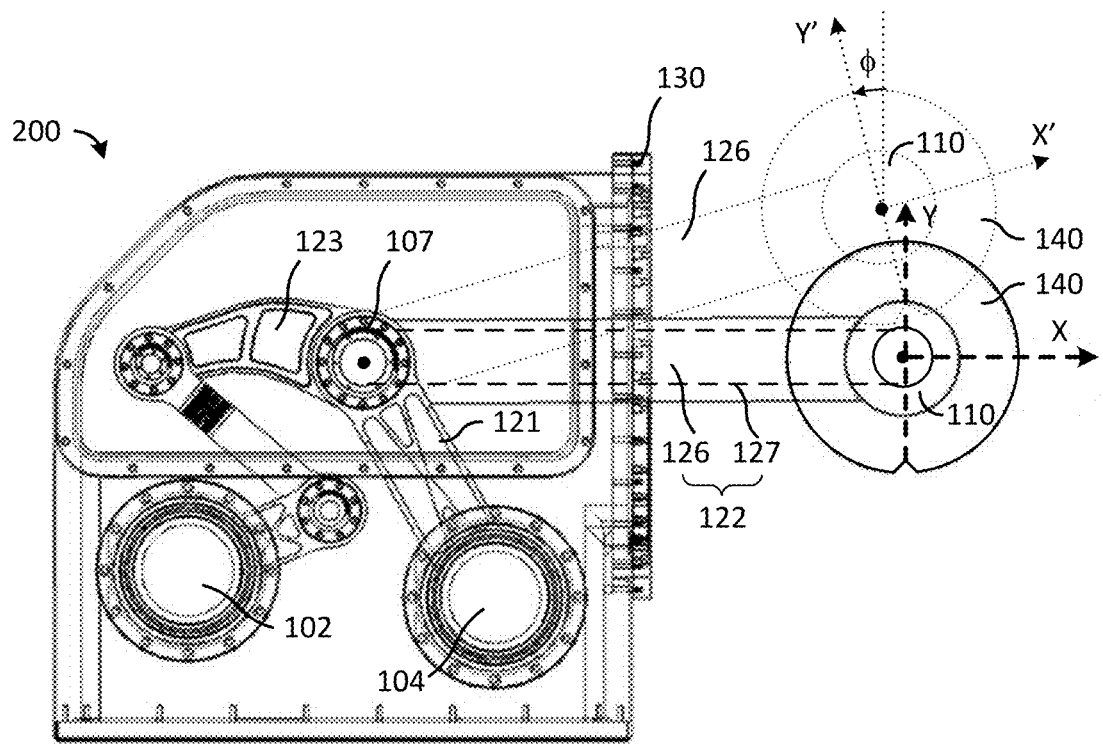
FIG. 8B illustrates a cross-sectional view of a scanning apparatus loaded with a wafer, in accordance with an embodiment.

FIGS. 8A and 8B illustrate the motorized belt-and-pulley system 127 used for maintaining a constant twist angle throughout a scan pass using the scanning apparatus 200. FIG. 8A reproduces FIGS. 7A and 7B to compare the change in the inclination of the belted fifth bar link 122 at two different points in the trajectory of the wafer 140 illustrated in the sequence of FIGS. 7A-7F. The wafer notch is at the bottom of the wafer 140 in FIG. 8A. FIG. 8B reproduces the position of the scanning apparatus 200 and the wafer 140 shown in FIG. 7A (and reproduced in FIG. 8A), wherein the belted fifth bar link 122 of the scanning apparatus 200 is extending roughly perpendicularly through the rotatable feedthrough 130.

Superposed on this image is an inclined fifth bar link 126 having an inclination similar to that of belted fifth bar link 122 in FIG. 7B (and reproduced in the lower image of the scanning apparatus 200 in FIG. 8A). The substrate holder no and the wafer 140, attached to fifth bar link 126, are also shown. The superposed items (the fifth bar link 126, substrate holder 110, and the wafer 140) are drawn in dotted lines. Other parts of the scanning apparatus 200 with the inclined position of the fifth bar link 126 have been omitted for clarity. It is noted that this omission may give the appearance of inconsistency in the positions of the omitted parts. For example, the angle formed by the inclined fifth bar link 126 and the second bar link 123 appear inconsistent because, as explained above with reference to FIG. 2, whereas this angle has been fixed in the design of scanning apparatus 200. The self-consistent positions of all the parts of the bar-and-hinge system may be seen in the respective positions in FIG. 7B (and is also reproduced in the lower image of the scanning apparatus 200 in FIG. 8A).

As described above with reference to FIG. 2, and seen in FIG. 8B, the fifth bar link 126, by itself, is without the motorized the belt-and-pulley system 127. The fifth bar link 126 and the motorized belt-and-pulley system 127 may be combined to form the belted bar link 122. With the motorized belt-and-pulley system 127 of the belted fifth bar link 122, the planar surface of the substrate holder 110 (together with the wafer 140) may be able to rotate relative to the fifth bar link 126 of the belted fifth bar link 122. The rotation, being about the central axis normal to the planar surface, alters the twist angle, ϕ; hence the drive for the motorized belt-and-pulley system 127 is referred to as the twist drive. In one embodiment, the twist drive for the twist angle adjustment is embedded in the belted fifth bar link 122. In some other embodiment, the twist drive may be embedded in some other bar link.

In yet another embodiment, described with reference to FIGS. 8C-8F, the twist drive may be coaxial with the rotary drive 104 and may include a motorized belt-and-pulley systems embedded to rotate the substrate holder no in order to control the twist angle, ϕ.

Figure 8C:
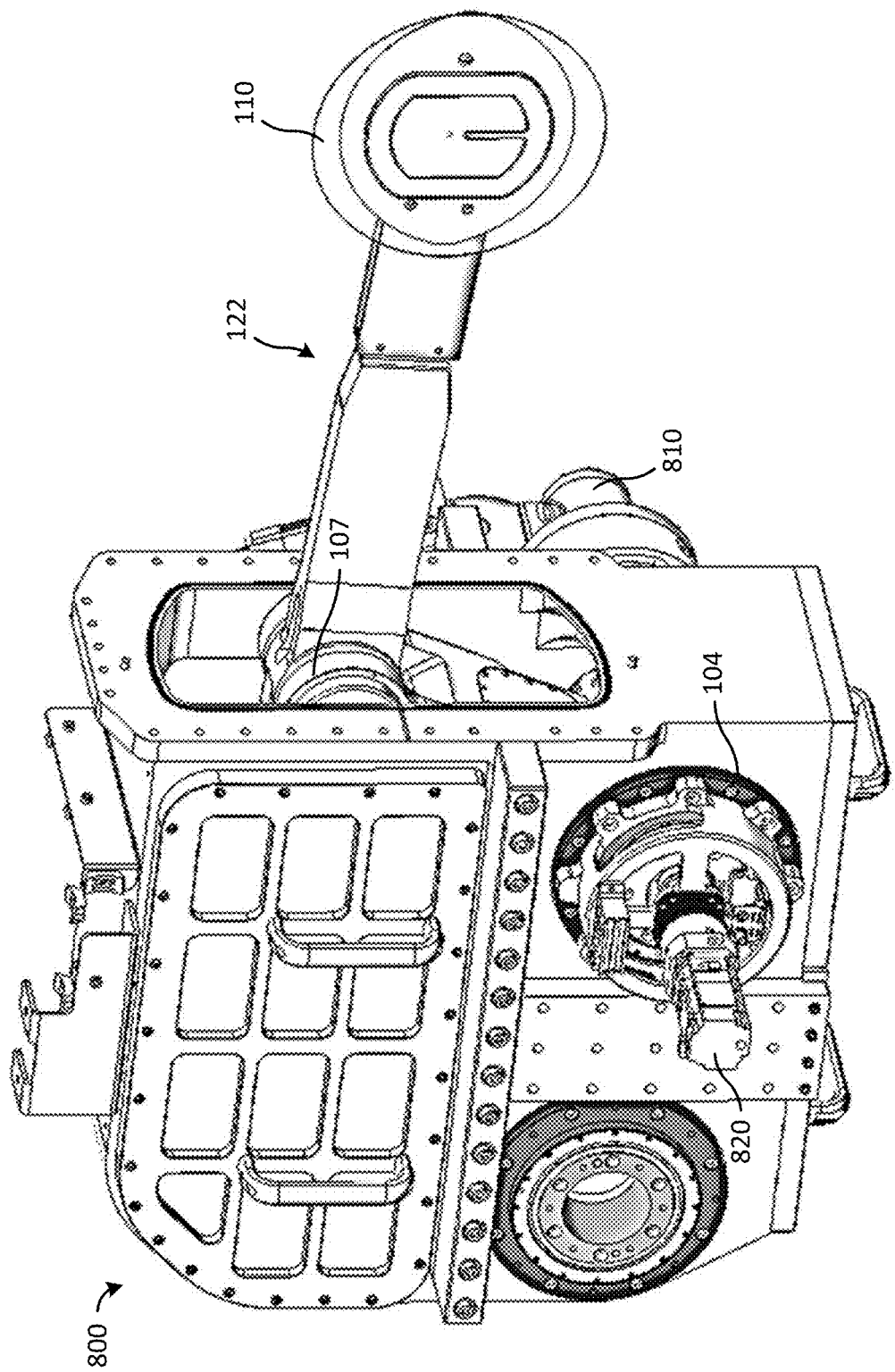
FIG. 8C illustrates a perspective view of a scanning apparatus with a twist drive coaxial with another rotary drive, in accordance with an embodiment.

FIG. 8C illustrates a perspective view of a scanning apparatus 800 wherein the twist drive is coaxial with the second rotary drive 104. As illustrated in FIG. 8C, a first motor 810 may provide the drive for the bar links, while a second motor 820, coaxial with the first motor 810, may be used to drive a belt-and-pulley system via which the substrate holder no may be rotated to control the twist angle, (I). The belt-and-pulley system is illustrated in FIGS. 8D-8F.

Figure 8D:
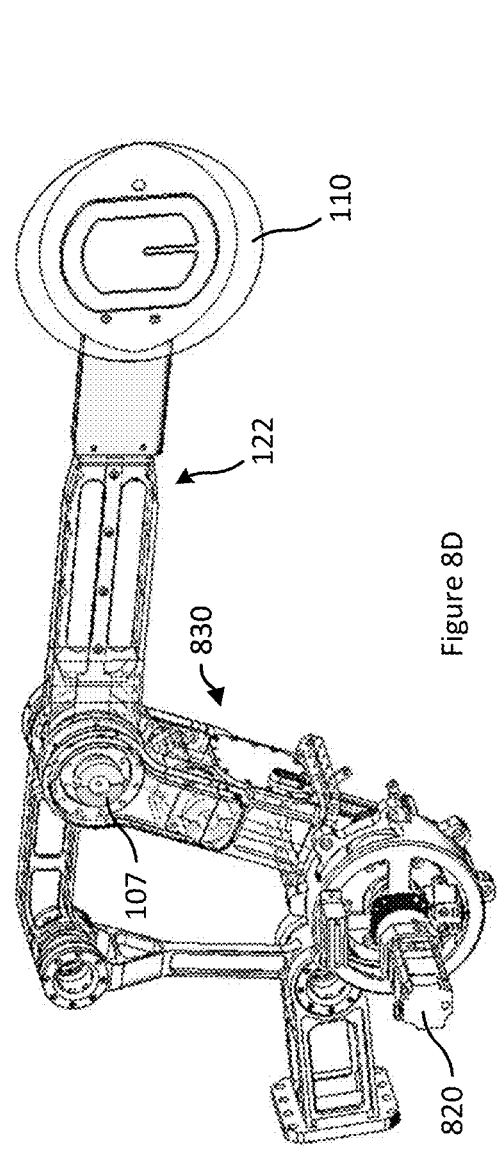
FIG. 8D illustrates a perspective view of an exposed portion of the scanning apparatus of FIG. 8C.
Figure 8E:
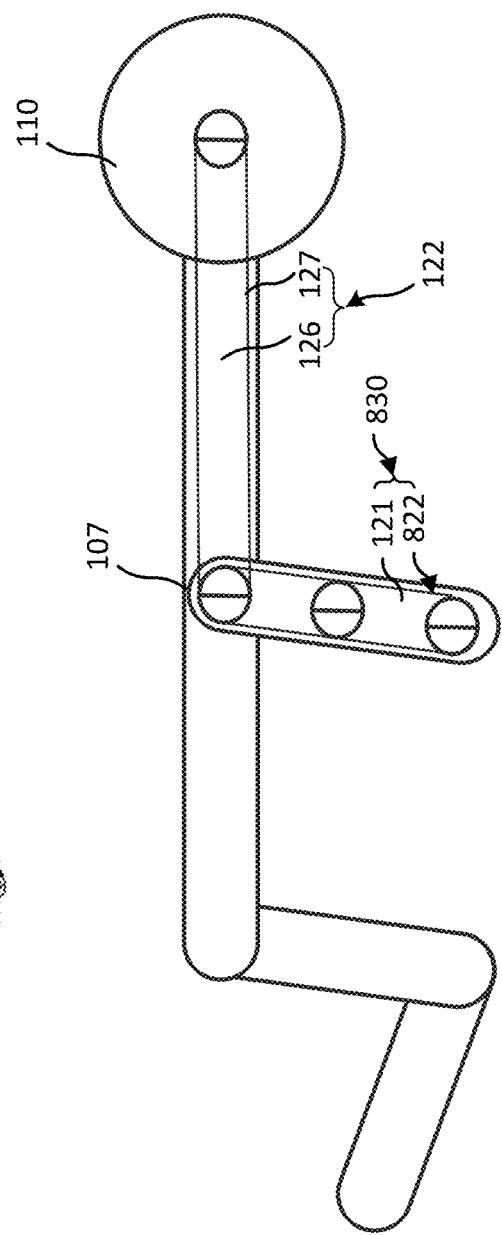
FIG. 8E is a schematic illustration of the portion of the scanning apparatus of FIG. 8D.

A perspective view of the belted bar links 830 and 122, used to adjust the twist angle is shown in FIG. 8D and a schematic view illustrated in FIG. 8E indicates the belt-and-pulley systems 127 and 822 embedded in the fifth bar link 126 and the first bar link 121, respectively. The belted bar link 122, comprising the fifth bar link 126 and the belt-and-pulley system 127 in the scanning apparatus 800, may be similar to the belted bar link 122 in the scanning apparatus 200, described above with reference to FIG. 8B. While the belt-and-pulley system 127 in FIG. 8E uses one belt, the belted bar link 830 comprises a belt-and-pulley system 822 comprising two belts.

Figure 8F:
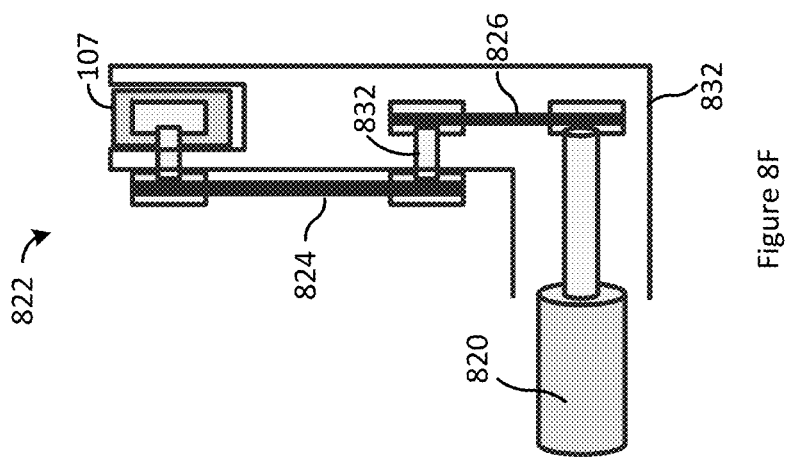
FIG. 8F is a detailed zoomed in schematic illustration of a portion of the scanning apparatus of FIG. 8E.

FIG. 8F illustrates a zoomed in schematic of the dual belt belt-and-pulley system 822. The second motor 820 used to drive the belt-and-pulley systems 127 and 822 is shown coupled to pulleys for the first belt 826. As illustrated in FIG. 8F, the second motor 820 and the first belt 826 are disposed in a compartment 832 that may be at atmospheric pressure. A rotary vacuum feedthrough 832 couples the first belt 826 with a second belt 824 by connecting two pulleys on opposite sides of the rotary vacuum feedthrough 832. As illustrated in FIG. 8F, one of the two pulleys is connected to the first belt 826 in atmospheric pressure, while the other pulley is connected to the second belt 824 in vacuum. The second belt couples the twist drive to the belt-and-pulley system 127 of the belted bar link 122 via the third hinge 107. As described above with reference to FIG. 8B, and illustrated in FIGS. 8C through 8E, the belted bar link 122 is coupled to the substrate holder 110.

The additional degree of freedom of rotation provided to the substrate holder no by motorized belt-and-pulley systems (e.g., belt-and-pulley systems 127 and 822) may maintain the orientation of the wafer notch and, hence, the twist angle, constant during the scan. (In this example, ϕ=0°). The rotary bearings used for the motorized belt-and-pulley system 127 of the belted fifth bar link 122 may be sealed from contaminants, as mentioned above in the context of the first and the second rotary drives 102 and 104 described with reference to FIG. 2.

Unlike the horizontal bar link 126 of the belted fifth bar link 122, the inclined fifth bar link 126 (shown in dotted lines in FIG. 8B) does not include the motorized belt-and-pulley system 127. In the absence of the motorized belt-and-pulley system 127, the substrate holder no (drawn as a dotted circle in FIG. 8B) is rigidly connected to the inclined fifth bar link 126. Accordingly, the wafer notch deviates from the position with which the wafer 140 was initially placed on the substrate holder no of the scanning apparatus 200. For example, as illustrated in FIG. 8B, the notch was initially towards the bottom or, equivalently, the Y-axis was vertical (ϕ=0°). As the bar link gets inclined, the X-Y plane of the wafer 140 rotates by the same angle by which the fifth bar link 126 gets inclined. The rotated X and Y axes, denoted as X' and Y' in FIG. 8B, illustrate the deviation of ϕ from its initial value of 0°.

As explained above, in the absence of active twist angle control, the change in the inclination of the fifth bar link 126 during a scan causes a respective deviation of ϕ from its initial value. The deviation, Δϕ, may be changing continuously in tandem with the dynamically changing position of the wafer 140 as it is moved in the X-Y plane. The rotor controller 101 (see FIG. 1) may be programmed to synchronize the motorized belt-and-pulley system 127 with the circular motion of the rotors 102 and 104 to maintain Δϕ at roughly zero degrees. The synchronous active twist angle control may maintain the desired twist angle, ϕ, during a scan. It may also vary ϕ, if it is desirable to use a different twist angle in different regions of the wafer 140.

Figure 9A:
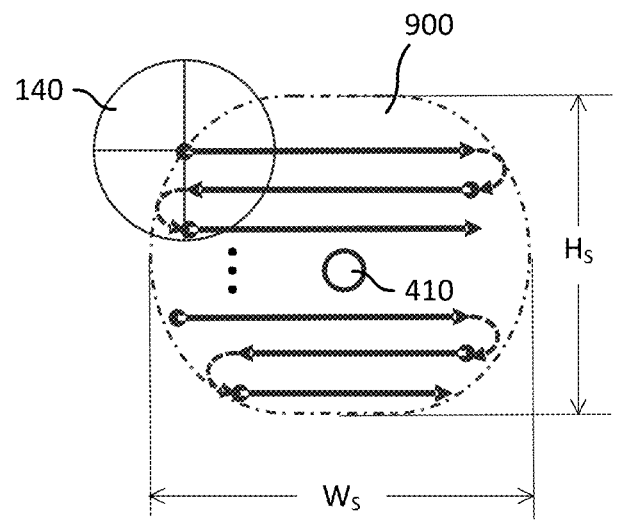
FIG. 9A illustrates a schematic of a scanning trajectory of a wafer scanned through a planar scan area, in accordance with an embodiment.
Figure 9B:
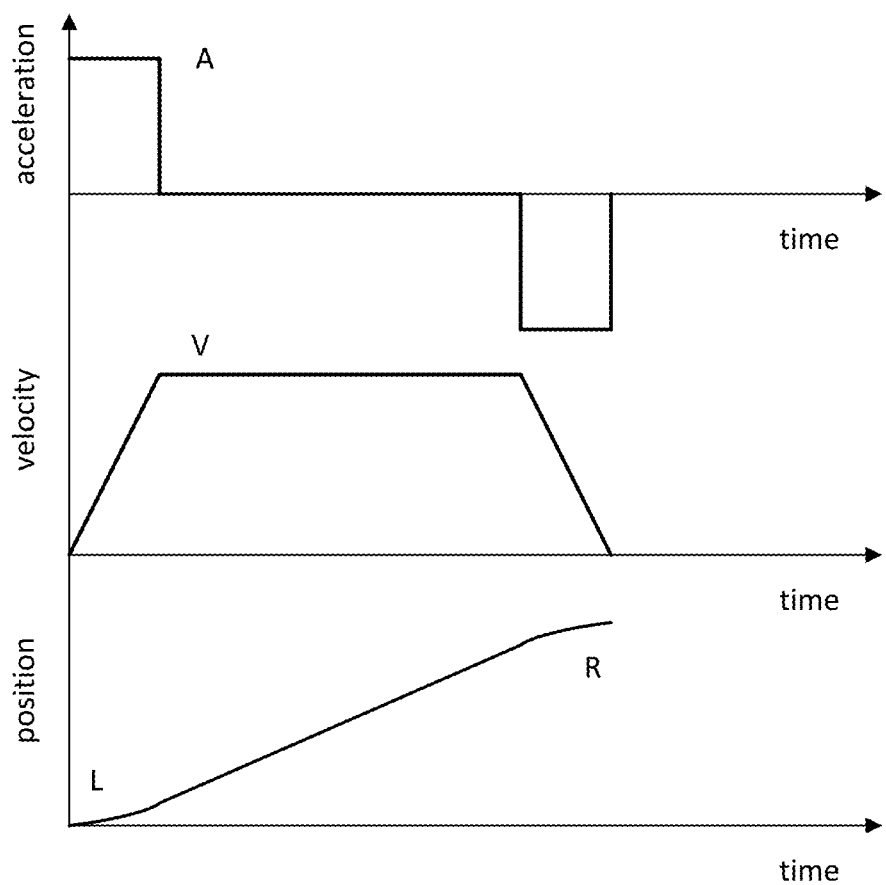
FIG. 9B illustrates plots of acceleration, velocity, and position vs. time profiles for one horizontal trace across the scan area of the scan path illustrated in FIG. 9A.

FIG. 9A illustrates a schematic of a planar scanning trajectory of a wafer scanned through a planar scan area 900 by the scanning apparatus 200 described above. FIG. 9B illustrates plots of acceleration, velocity, and position vs. time profiles for one horizontal trace across the scan area of the scan path illustrated in FIG. 9A. The scanning trajectory illustrated in FIG. 9A is that of the center of the wafer 140 having a diameter equal to 300 mm, loaded onto a Coulombic style electrostatic substrate holder having a 200 mm wide diameter. The trajectory is a horizontal raster starting at the top left of the scan area and comprises a family of horizontal traces indexed by about 1 mm to about 2 mm to cover the scan area from top-to-bottom. The horizontal traces alternate between left-to-right and right-to-left. The width $W_S$ and height $H_S$ of the scan area 900 has to be at least the minimum needed to span the entire wafer surface through the GCIB 410, shown at the center of the scan area 900. In this example, $H_S$ has been set to 300 mm, and $W_S$ has been set to 450 mm. The 150 mm additional width may be used to ramp up the wafer velocity from zero to a scan velocity, V, of the raster and ramp it down to zero before the return trace. As illustrated in FIG. 5B, the wafer may be accelerated at the beginning of each horizontal scan with a constant acceleration, A, to ramp the velocity up from zero to a scan velocity, V, and ramp down to zero at the end of each horizontal trace. In one embodiment, the maximum acceleration may be about 25 m/s$^2$ to about 50 m/s$^2$ and the maximum scan velocity may be about 1 m/s to about 1.5 m/s. Towards the end of the scan, the scan velocity may be ramped down to zero, the wafer 140 indexed downward and the return scan initiated. The scan velocity may be adjusted during the scan, depending on the application.

The wafer scanning system 10 and the scanning apparatus 200 have been designed for beam processing of wafers using, for example GCIB. The scanning apparatus 200 provides several advantages. By using rotary actuators (first and the second rotary drives 102 and 104) as the primary actuating mechanism, and by placing many of the moving parts of the wafer scanner 120 in a separate scanning chamber 100, the wafer scanning system 10 provides the advantages of reduced contamination from processing byproducts and low-cost of maintenance. A rotatable feedthrough 130 allows the wafer 140 to be accessed remotely by a belted bar link 122 passing through the rotatable feedthrough 130 to the processing chamber iso. The rotatable feedthrough 130 may adjust the tilt angle of the wafer over a wide range, from a horizontal loading position to a processing tilt angle of 65° in about 8 seconds. The wafer scanning apparatus 200 has been designed to scan the wafer through a GCIB 410 over a full range of motion in a scanning plane that is coplanar with the wafer surface. The scanning plane being roughly coincident with the wafer surface provides the advantage of maintaining the beam (e.g., the GCIB) in focus, thereby providing better control of beam size and shape during scanning. A belt-and-pulley system (e.g., belt-and-pulley systems 127 and 822) provides the advantage of maintaining a constant twist angle throughout one pass of the wafer scan, irrespective of the planar position and the tilt angle of the wafer 140.

Figure 10:
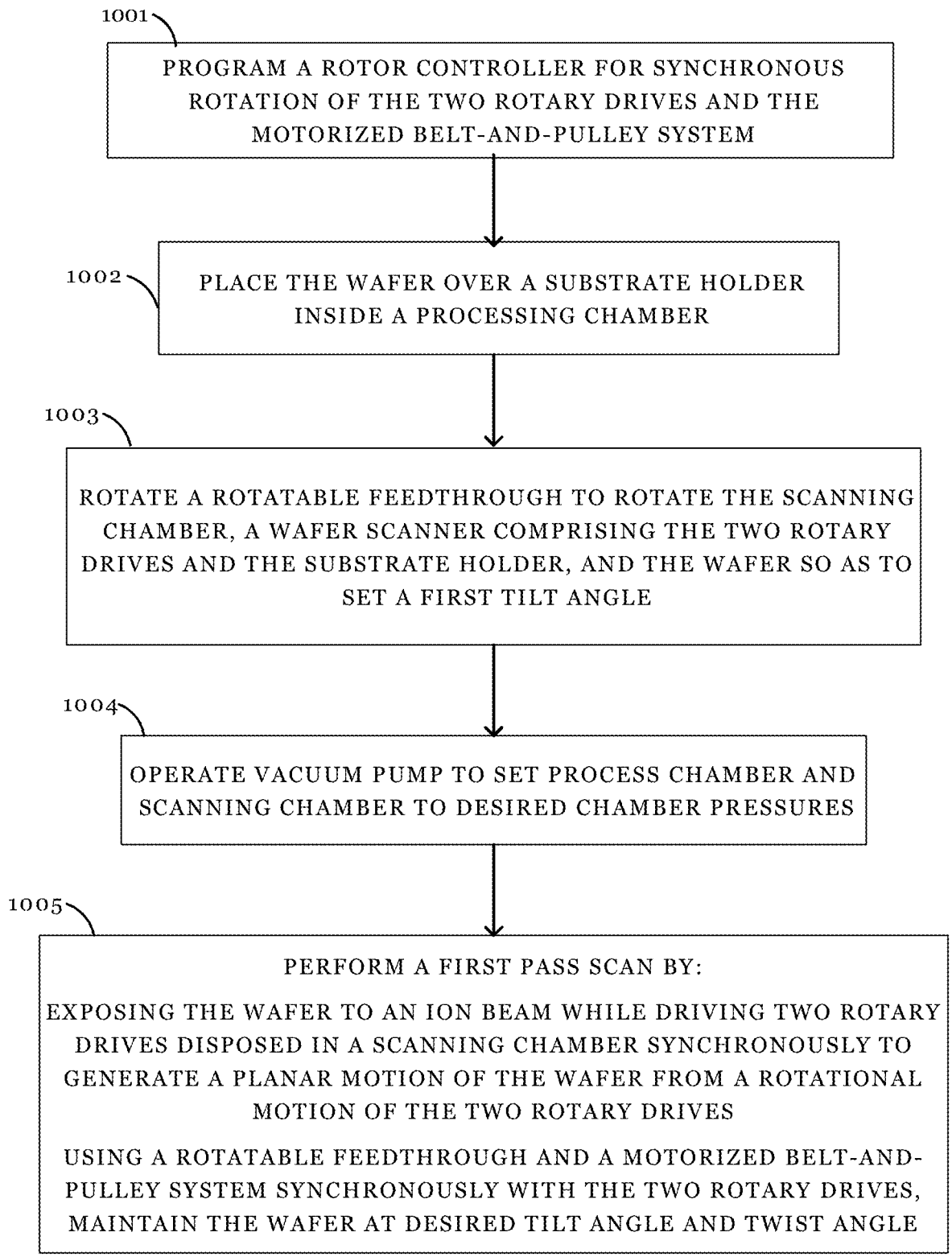
FIG. 10 illustrates a method of operating a scanning system in accordance with embodiments of the invention.

FIG. 10 illustrates a method of operating a scanning system in accordance with embodiments of the invention. The steps described below are also been described above using FIGS. 1-9.

Referring to box 1001, a rotor controller is programmed for synchronous rotation of the two rotary drives and the motorized belt-and-pulley system. For example, this may be the rotor controller 101 discussed in FIG. 1.

Referring next to box 1002, a wafer is placed over a substrate holder inside a processing chamber. In one or more embodiments as described above, a wafer may be loaded from a load lock chamber through a wafer transfer window of the processing chamber.

A rotatable feedthrough may be rotated so as to rotate the scanning chamber, wafer scanner, which includes the rotary drives and bar-and-hinge system and the substrate holder, and the wafer so as to set a tilt angle (see box 1003).

As next illustrated in box 1004, one or more vacuum pumps may be operated to set a desired pressure within the scanning chamber and the processing chamber, which may be different.

Next, as illustrated in box 1005, the wafer is scanned through an ion beam by driving the rotary drives synchronously. The rotary motion of the rotary drives is converted to a planar motion using the bar-and-hinge system described above, which in addition may maintain a path distance of the ion beam from an ion source to the wafer at a constant distance during the planar motion. A rotatable feedthrough and a motorized belt-and-pulley system may be used to orient the wafer at a desired tilt angle and twist angle, and maintain the tilt angle and the twist angle unchanged during scanning.

Example 1. A scanning system includes a scanning chamber; a first rotary drive disposed in the scanning chamber and configured to rotate around a first axis; a second rotary drive disposed in the scanning chamber and configured to rotate around the first axis synchronously with the first rotary drive; and a bar-and-hinge system disposed in the scanning chamber and mechanically coupled to a substrate holder, the hinge system configured to translate a rotary motion of the first rotary drive and the second rotary drive to a planar motion of the substrate holder.

Example 2. The scanning system of example 1, further including: a processing chamber, the substrate holder being disposed in the processing chamber.

Example 3. The scanning system of one of examples 1 or 2, where the scanning chamber is sealed from the processing chamber.

Example 4. The scanning system of one of examples 1 to 3, where the scanning chamber is configured to be pressurized at a first pressure, and the processing chamber is configured to be pressurized at a second pressure different from the first pressure.

Example 5. The scanning system of one of examples 1 to 4, where the scanning system is configured to expose a wafer disposed on the substrate holder to an ion beam during the planar motion.

Example 6. The scanning system of one of examples 1 to 5, where a path distance of the ion beam from an ion source to the wafer is maintained at a constant distance during the planar motion.

Example 7. The scanning system of one of examples 1 to 6, where the scanning system is configured to expose a wafer disposed on the substrate holder at a constant tilt angle and twist angle during the planar motion.

Example 8. The scanning system of one of examples 1 to 7, further including: a rotatable feedthrough attached rigidly on to a wall of the scanning chamber and including an opposite side attached to a wall of the processing chamber.

Example 9. The scanning system of one of examples 1 to 8, where the scanning chamber is configured to be rotated about an axis passing through the center of the rotatable feedthrough and normal to the wall of the processing chamber to which a rotary part of the rotatable feedthrough is attached.

Example 10. The scanning system of one of examples 1 to 9, where the bar-and-hinge system includes: a first passive hinge, a second passive hinge, and a third passive hinge, the first, the second, and the third passive hinges being configured to rotate around the first axis; a first bar link rotatably coupling the second rotary drive to the third passive hinge; a second bar link rotatably coupling the second passive hinge with the third passive hinge; a third bar link rotatably coupling the first passive hinge with the second passive hinge; a fourth bar link rotatably coupling the first rotary drive to the first passive hinge; and a belted bar link supporting the substrate holder, the belted bar link being coupled to the second bar link through the third passive hinge.

Example 11. A scanning system including: a first rotary drive configured to rotate around a first axis; a second rotary drive configured to rotate, around the first axis, synchronously with the first rotary drive; and four bar links coupling the first and the second rotary drives to a substrate holder through three passive hinges and a belted bar link, where a rotational motion of the first and the second rotary drives is configured to be translated to motion along a plane over a surface of the substrate holder using the four bar links, the belted bar link, and the three passive hinges about which the four bar links rotate, the plane having a surface normal parallel to the first axis.

Example 12. A method of scanning a wafer, the method including: placing the wafer over a substrate holder inside a processing chamber, the wafer being placed at a first twist angle relative to a reference axis of a rotatable feedthrough of the processing chamber; and performing a first pass scan by exposing the wafer to an ion beam while driving two rotary drives disposed in a scanning chamber synchronously to generate a planar motion of the wafer from a rotational motion of the two rotary drives, the wafer being oriented continuously at the first twist angle when performing the first pass scan.

Example 13. The method of example 12, further including maintaining a path distance of the ion beam from an ion source to the wafer at a constant distance during the planar motion of the first pass scan.

Example 14. The method of one of examples 12 or 13, further including programming a rotor controller for synchronous rotation of the two rotary drives.

Example 15. The method of one of examples 12 to 14, further including: establishing a differential pressure between the scanning chamber and the processing chamber.

Example 16. The method of one of examples 12 to 15, further including, after performing the first pass scan, setting a second twist angle and rotating the wafer inside the processing chamber to the second twist angle and driving the two rotary drives synchronously to perform a second pass scan, where the second pass scan is performed at the second twist angle across all of a major surface of the wafer.

Example 17. The method of one of examples 12 to 16, further including: rotating a rotatable feedthrough to rotate the scanning chamber, a wafer scanner including the two rotary drives and the substrate holder, and the wafer so as to set a first tilt angle.

Example 18. The method of one of examples 12 to 17, where the first pass scan is performed at the first twist angle and the first tilt angle across an entire surface of the wafer.

Example 19. The method of one of examples 12 to 18, further including, after performing the first pass scan, rotating the rotatable feedthrough to set a second tilt angle for processing and driving the two rotary drives synchronously to perform a second pass scan, where the second pass scan is performed at the first twist angle and the second tilt angle.

Example 20. The method of one of examples 12 to 19, further including, after performing the first pass scan, rotating the wafer inside the processing chamber to a second twist angle, rotating the rotatable feedthrough to set a second tilt angle for processing, and driving the two rotary drives synchronously to perform a second pass scan, where the second pass scan is performed at the second twist angle and the second tilt angle across all of a major surface of the wafer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of scanning a wafer, the method comprising:
   placing the wafer over a substrate holder inside a processing chamber, the wafer being placed at a first twist angle relative to a reference axis of a rotatable feedthrough of the processing chamber; and
   performing a first pass scan by exposing the wafer to an ion beam while driving two rotary drives disposed in a scanning chamber synchronously to generate a planar motion of the wafer from a rotational motion of the two rotary drives, the wafer being oriented continuously at the first twist angle when performing the first pass scan.

2. The method of claim 1, further comprising maintaining a path distance of the ion beam from an ion source to the wafer at a constant distance during the planar motion of the first pass scan.

3. The method of claim 1, further comprising, after performing the first pass scan, setting a second twist angle and rotating the wafer inside the processing chamber to the second twist angle and driving the two rotary drives synchronously to perform a second pass scan, wherein the second pass scan is performed at the second twist angle across all of a major surface of the wafer.

4. The method of claim 1, further comprising:
   rotating the rotatable feedthrough to rotate the scanning chamber, a wafer scanner comprising the two rotary drives and the substrate holder, and the wafer so as to set a first tilt angle relative to a plane normal to the ion beam, the rotating being around an axis passing through the center of the rotatable feedthrough and normal to a wall of the processing chamber to which a rotary part of the rotatable feedthrough is attached, and wherein the first pass scan is performed at the first twist angle and the first tilt angle across an entire surface of the wafer.

5. The method of claim 4, further comprising:
   after performing the first pass scan, setting a second tilt angle; and
   performing a second pass scan, wherein the second pass scan is performed at the first twist angle and the second tilt angle across an entire surface of the wafer.

6. The method of claim 1, further comprising:
   during the first pass scan, maintaining the scanning chamber at a first pressure; and
   during the first pass scan, maintaining the processing chamber at a second pressure different from the first pressure to prevent byproducts produced in the processing chamber from entering the scanning chamber.

7. The method of claim 1, further comprising forming the ion beam by forming gas clusters and ionizing the gas clusters.

8. The method of claim 1, wherein rotating the rotatable feedthrough comprises maintaining the first tilt angle at a value between −90° and 65°.

9. A method of gas cluster ion beam (GCIB) processing for a wafer, the method comprising:
   forming a gas cluster beam by condensing a process gas;
   ionizing the gas cluster beam to form a stationary GCIB, the stationary GCIB being directed into the a processing chamber comprising the wafer placed over a substrate holder in the processing chamber; and
   exposing the wafer to the GCIB and scanning the wafer to be processed with the GCIB, the scanning comprising synchronously driving two rotary drives disposed in a scanning chamber to generate two rotational motions, and
   translating the two rotational motions, using a hinge system in the scanning chamber, to a planar motion of the substrate holder that is coplanar with a surface of the substrate holder.

10. The method of claim 9, wherein the stationary GCIB is a horizontal beam.

11. The method of claim 9, further comprising rotating the scanning chamber around an axis normal to the stationary GCIB to tilt the substrate holder and the wafer to a first tilt angle relative to the stationary GCIB.

12. The method of claim 11, wherein the scanning further comprises maintaining the first tilt angle during the scanning.

13. The method of claim 9, further comprising rotating the substrate holder around a central axis normal to the surface of the substrate holder to a first twist angle.

14. The method of claim 13, wherein the scanning further comprises maintaining the first twist angle during the scanning.

15. A method of processing a wafer with an ion beam, the method comprising:
- in a processing chamber, performing a first pass scan by exposing the wafer to an ion beam according to a first planar motion of the wafer, the wafer being held at a first twist angle and a first tilt angle during the first pass scan, the first twist angle being relative to a reference axis of a rotatable feedthrough of the processing chamber, the first tilt angle being relative to a plane normal to the ion beam; and
- in the processing chamber, performing a second pass scan by exposing the wafer to the ion beam according to a second planar motion of the wafer, the wafer being held at a second twist angle and a second tilt angle during the second pass scan.

16. The method of claim 15, further comprising driving two rotary drives disposed in a scanning chamber synchronously to generate the first planar motion of the wafer and the second planar motion of the wafer, the scanning chamber being connected to the processing chamber with the rotatable feedthrough.

17. The method of claim 16, further comprising, prior to the first pass scan, rotating the rotatable feedthrough to rotate the scanning chamber, a wafer scanner comprising the two rotary drives and a substrate holder holding the wafer, and the wafer to set the first tilt angle.

18. The method of claim 15, further comprising, prior to the first pass scan, rotating a substrate holder holding the wafer around a central axis normal to the surface of the substrate holder to set the first twist angle.

19. The method of claim 15, wherein the ion beam is a gas cluster ion beam (GCIB), further comprising forming the GCIB by condensing a process gas to form a gas cluster beam and ionizing the gas cluster beam.

20. The method of claim 15, the first pass scan comprising scanning an entire surface of the wafer through the ion beam.

* * * * *